(12) United States Patent
Lin

(10) Patent No.: US 6,180,997 B1
(45) Date of Patent: Jan. 30, 2001

(54) STRUCTURE FOR A MULTI-LAYERED DIELECTRIC LAYER AND MANUFACTURING METHOD THEREOF

(75) Inventor: Chi-Fa Lin, Hsinchu (TW)

(73) Assignee: Winbond Electronics Corp., Hsinchu (TW)

(*) Notice: Under 35 U.S.C. 154(b), the term of this patent shall be extended for 0 days.

(21) Appl. No.: 09/354,024

(22) Filed: Jul. 15, 1999

Related U.S. Application Data

(62) Division of application No. 09/178,464, filed on Oct. 23, 1998.

(30) Foreign Application Priority Data

Feb. 23, 1998 (TW) .................................................. 87102522

(51) Int. Cl.[7] .................................................. H01L 23/58
(52) U.S. Cl. .......................... 257/637; 257/635; 257/640
(58) Field of Search ..................................... 257/758, 760, 257/637, 640, 635; 438/713, 701, 738, 717, 735, 736, 737

(56) References Cited

U.S. PATENT DOCUMENTS

| | | | |
|---|---|---|---|
| 4,342,617 | * 8/1982 | Fu et al. ................................ | 438/701 |
| 4,814,041 | * 3/1989 | Auda ..................................... | 438/784 |
| 5,041,397 | * 8/1991 | Kim et al. ............................. | 438/702 |
| 5,858,824 | * 1/1999 | Saitoh ................................... | 438/167 |
| 5,940,732 | * 8/1999 | Zhang ................................... | 438/640 |

OTHER PUBLICATIONS

Wolf et al., "Silicon Processing", vol. 1, 532–535, Lattice Press, 1986.*

* cited by examiner

Primary Examiner—Minh Loan Tran
Assistant Examiner—Shouxiang Hu
(74) Attorney, Agent, or Firm—J.C. Patents; Jiawei Huang

(57) ABSTRACT

A manufacturing method and a structure of a multi-layered dielectric layer for forming openings in the dielectric layers for improving integration of integrated circuits, capability of step coverage, and problems caused by a structure of overhang, in which oblique sidewalls of the openings in multi-layered dielectric layer can improve the step coverage in the following manufacturing process.

20 Claims, 8 Drawing Sheets

STRUCTURE FOR A MULTI-LAYERED DIELECTRIC LAYER AND MANUFACTURING METHOD THEREOF

CROSS-REFERENCE TO RELATED APPLICATION

This application is a divisional application of the prior application No. 09/178,464 filed on Oct. 23, 1998.

BACKGROUND OF THE INVENTION

1. Field of the Invention

This invention relates to a structure for a multi-layered dielectric layer and a manufacturing method thereof, and more particularly, to a structure and a manufacturing method of multi-layered dielectric layer in which an opening with a tapered profile is formed thereon.

2. Description of Related Art

In a manufacturing process of metallization for integrated circuits, a conductive area is provided for electrical conduction, over which a plurality of conductive layers are formed for a metallization process. An opening formed between the first conductive layer and the conductive area is a contact hole. The other openings between the first conductive layer and the other conductive layers are so-called via.

A conventional process of metallization includes, at first, providing a substrate, in which possesses a conductive area. The conductive area can be a source/drain region in the substrate or a metal line. Then a dielectric layer is deposited over the conductive area. After that, a process of planarization is performed. Then the dielectric layer is etched with a photoresist mask to define an opening which is a contact hole or a via. Finally, a metal layer is deposited over the conductive area to complete a mounted structure between the metal layer and the conductive area.

Regarding the conventional process above-described, there are some problems encountered for requirements of more intensive integration of integrated circuits. Referring to FIGS. 1a to 1d, showing cross-sectional views of several conventional methods for metallization.

Referring to FIG. 1a, shown the first conventional method for metallization. A dielectric layer 102 is formed over a conductive area 100 above a substrate 1. An opening, for example, an opening 10 is formed by a procedure of performing exposure, developing, and etching. The opening 10 possesses a nearly rectangular profile because of using an anisotropic etching. The more the integration intensity of integrated circuits, the closer the width between every two adjacent openings. When the width between the openings is decreased, the aspect ratio of the opening is correspondingly increased. It causes a bad performance of step coverage in the following process.

A structure of an overhang, for example an overhang 101a and an overhang 101b, is formed while a metal layer 104 is being deposited over the conductive area 100.

If the metal layer 104 is continuously deposited, the adjacent overhangs in the same opening, for example, the overhangs 101a and 101b in the opening 10 is connected each other, and then a void 101c is formed between the overhangs 101a and 101b. The void 101c is uncovered while performing a planarization procedure, and then contamination materials such as polymer are formed over the conductive area 100 are dropped into the void 101c. It causes some problems happened in the conduction in devices of the conductive area 100. Moreover, the overhangs formed in the openings cause the step coverage of the metal layer 104 worse, which makes the quality of the transistors in the conductive area 100 be worse.

Regarding problems caused by the rectangular structure formed by an anisotropic etching of a dry etching method, a second conventional method is provided for improving these problems. Referring to FIG. 1b, a dielectric layer 112 is formed over a conductive area 110 above a substrate 1, and then the conductive area 110 is performed exposure, developed, and etched with a photoresist layer 116. The etching procedure is, at first, using a wet etching, and then using a dry etching. Upper portions of the openings formed in the dielectric layer 112 above the conductive area 110 are larger in diameter than lower portions of the openings, for example, a upper portion 20a of the opening 20 is larger in diameter than a lower portion 20b of the opening 20. It will improve the problems caused by the overhangs formed in the openings in the following procedure.

The second conventional improving method causes some problems. One of these problems is that the lateral etching will consume higher percentage of planner surface budget. The consume in planner surface budget will reduce the photolithography overlayer process window during interconnect lithography process steps.

Moreover, when the integration intensity of integrated circuits increases, the openings of the dielectric layer 112 become closer. The oblique gaps formed by way of the lateral etching of the wet etching procedure can be easily connected with the adjacent opening. For example, the gap 113 in the opening 20 and the gap 114 in the opening 30 can be easily connected because that the width 112 between the gap 113 and the gap 114 is smaller than the prior art shown in FIG. 1a. Such phenomena will cause the photoresist lifting at the dense contact area due to wet etching reducing adhesion area between photoresist and dielectric.

A third conventional method is provided with forming polymers on sidewalls of the dielectric layer in the openings by adjusting etching recipe. Referring to FIG. 1c, at first, a conductive area 120 is formed over a substrate 1. Then a dielectric layer 122 is formed over the conductive area 120. By performing a procedure of exposure, developing, and etching with a photoresist layer (not shown), openings desired are formed in the dielectric layer 122. Polymers are then formed on sidewalls of the dielectric layer 122 in all openings by adjusting the etching recipe. For example, polymers 108 are formed in the sidewalls of the dielectric layer 122 in the opening 40 as shown in FIG. 1c. The polymers 108 may cause the contact metallization reliability failure. The rate of the etching in upper portions of the opening is faster than the rate of the etching in lower portions of the opening. Therefore, an opening with oblique sidewalls can be easily formed. However, defects of the third conventional method are found that it is difficult to eliminate the polymers and the angle of the oblique sidewalls is also difficult to be controlled.

A forth conventional method is introduced by forming spacers on sidewalls of openings in a dielectric layer. Referring to FIG. 1d, well-proportioned conformal spacers, for example, spacers 134 are formed on sidewalls in an opening 50 above the dielectric layer 130. The spacers 134 can be consisted of dielectric materials, which are difficultly etched away. In the following process, the opening 50 with an oblique angle is formed owing to the protection of the spacers 134. However, defects of the forth conventional method can be found that the spacers 134 can not be uniformly formed onto the sidewalls of the openings formed above the dielectric layer 130. It causes an overhang structure formed on an upper portion of the sidewalls in the openings. Moreover, there are some defects such as poor capability of step cover, limitation of a ratio of height and width, a higher cost and reducing the diameter of the contact hole.

SUMMARY OF THE INVENTION

It is therefore an objective of the present invention to provide a manufacturing method and a structure of a multi-layered dielectric layer for forming openings in the dielectric layers for improving integration of integrated circuits, capability of step coverage, and problems caused by a structure of overhang.

It is another an objective of the present invention to provide a manufacturing method and a structure of a multi-layered dielectric layer for forming openings in the dielectric layers, in which oblique sidewalls of the openings in multi-layered dielectric layer can improve the step coverage in the following manufacturing process.

In accordance with the foregoing and other objectives of the present invention, the invention provides a manufacturing method of forming openings of a multi-layered dielectric layer. The method comprises steps of, at first, providing a substrate, and a conductive area is formed therein. Then a multi-layered dielectric layer is formed above the conductive area, wherein the multi-layered dielectric layer has a gradient of etching rate. Next, the multi-layered dielectric layer is defined to form the openings in the multi-layered dielectric layer, whereby portions of the conductive area beneath the openings are uncovered. The gradient of etching rate of the multi-layered dielectric layer can improve integration of integrated circuits, capability of step coverage, and problems caused by a structure of overhang.

In accordance with the foregoing and other objectives of the present invention, the invention provides a structure of a substrate. A conductive area is formed in the substrate. A multi-layered dielectric layer is formed above the conductive area, wherein the multi-layered dielectric layer has a gradient of etching rate and at least an opening formed therein. The diameter of a portion of the opening near the surface of the conductive area is smaller than the diameter of a portion of the opening near the surface of the multi-layered dielectric layer. The oblique sidewalls of the openings in multi-layered dielectric layer can improve the step coverage in the following manufacturing process, and also can improve integration of integrated circuits, capability of step coverage, and problems caused by a structure of overhang.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
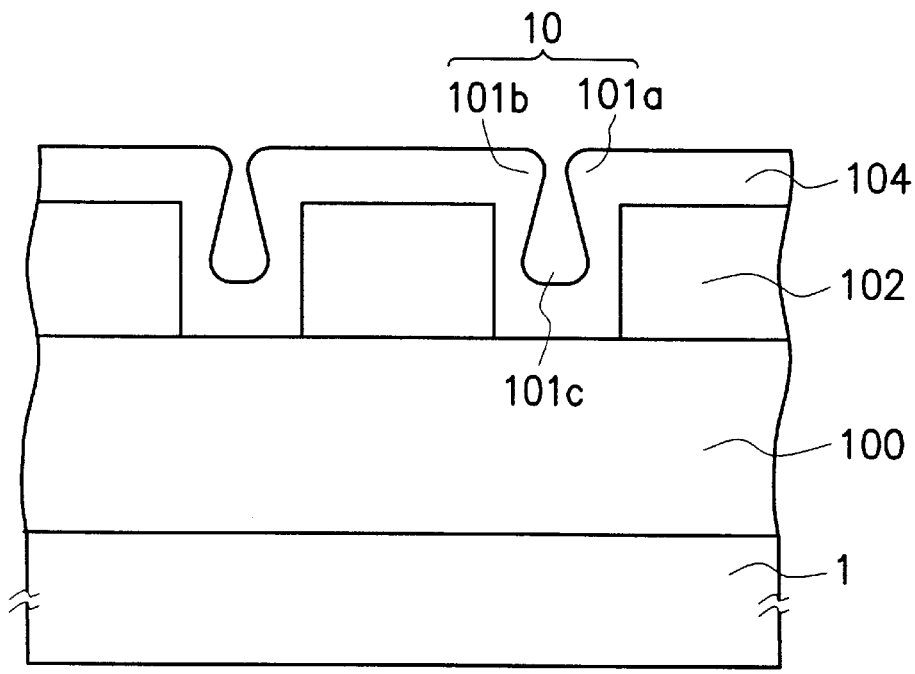
FIGS. 1a to 1d show cross-sectional views of several conventional methods for metallization.
Figure 1B:
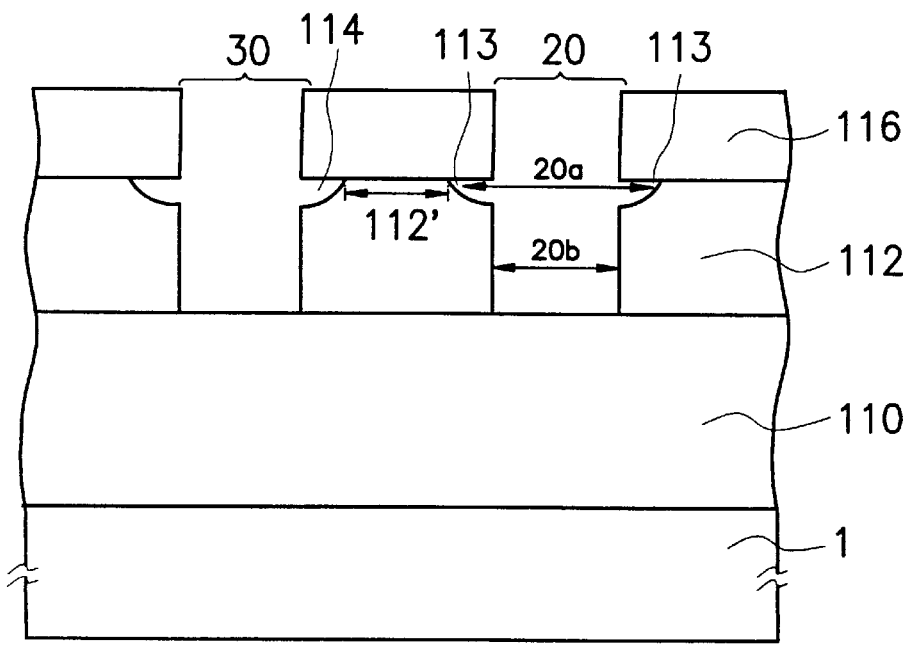
Figure 1C:
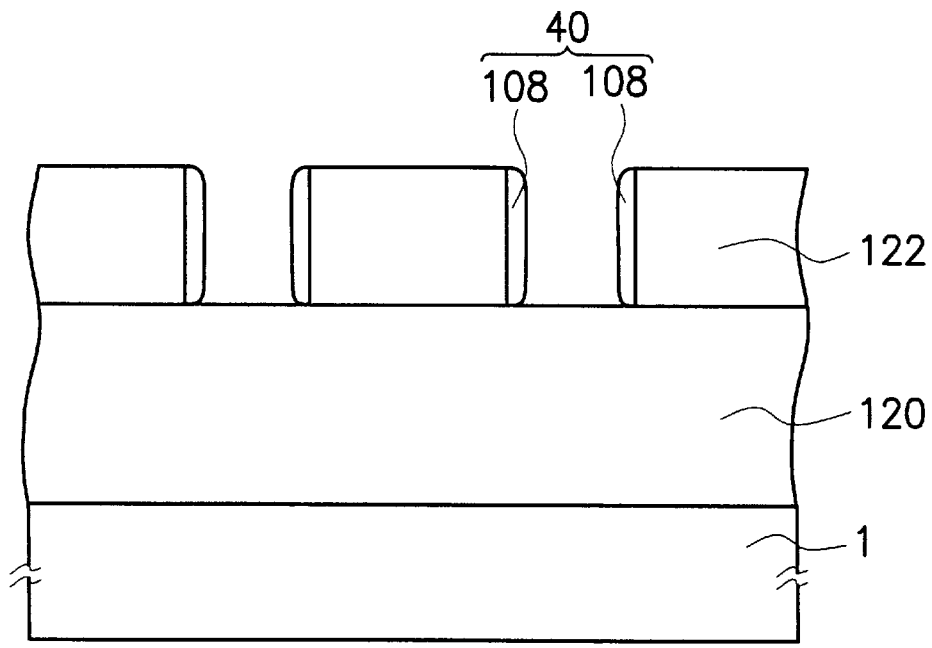
Figure 1D:
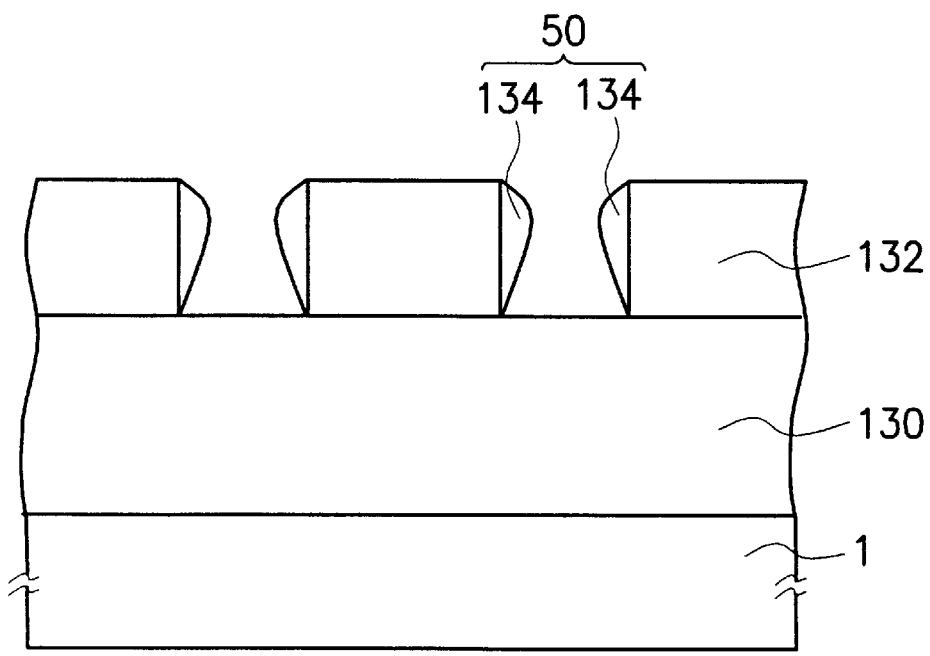
Figure 2A:
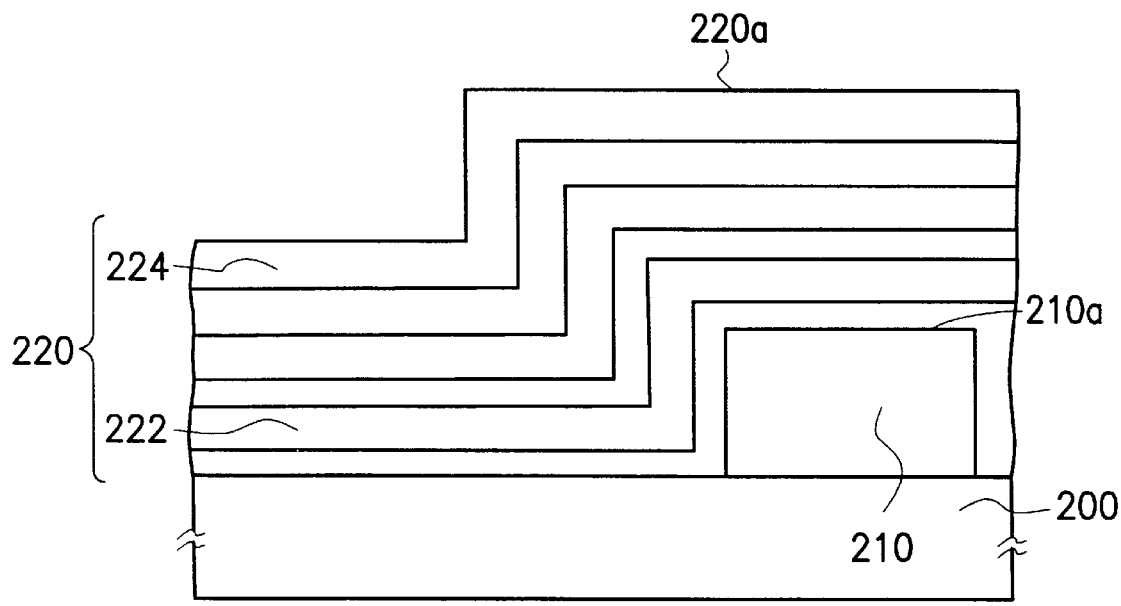
FIGS. 2a–2c show cross-sectional views of a process of forming openings in a lanarized multi-layered dielectric layer.
Figure 2B:
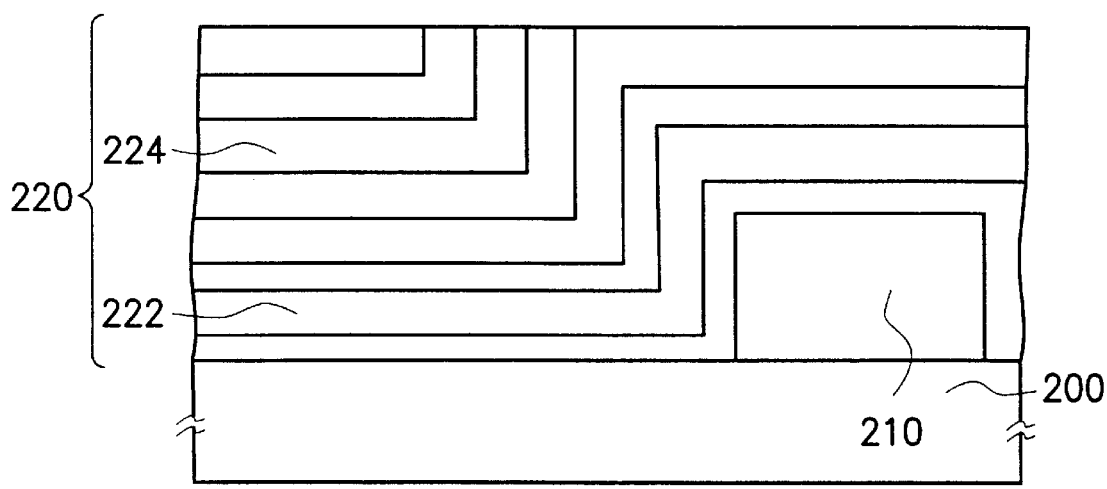
Figure 2C:
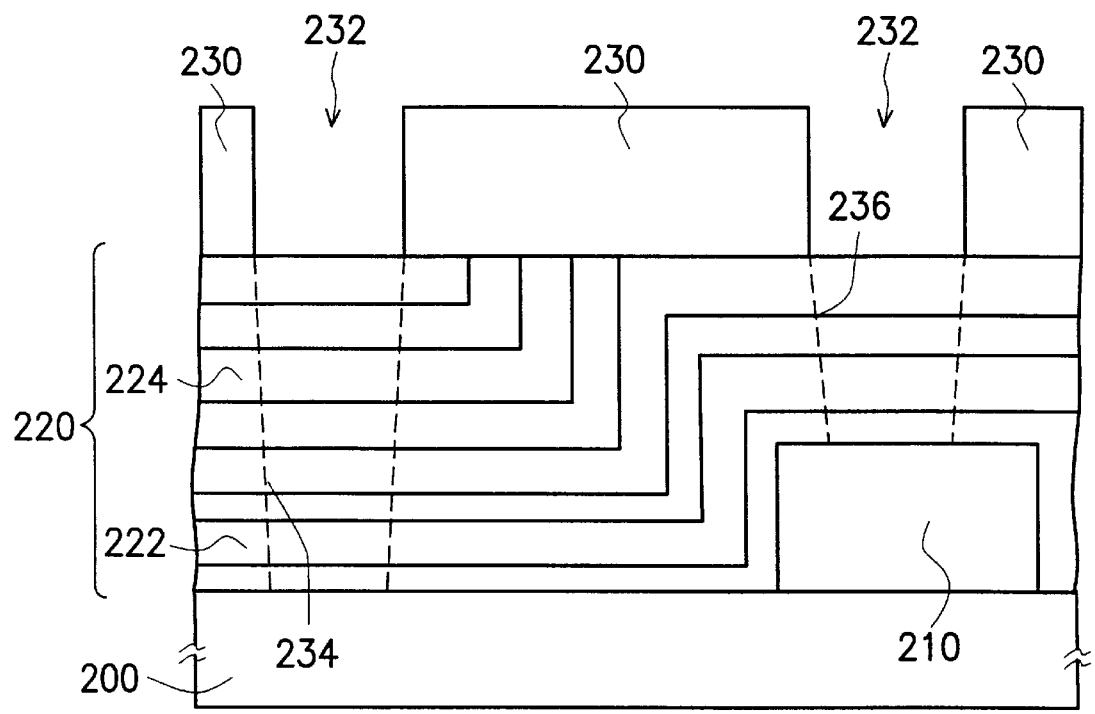

The invention disclosures a method for improving integration of integrated circuits, capability of step coverage, and problems caused by a structure of overhang by using a structure of multi-layered dielectric layer for forming openings in the dielectric layers. Referring to FIG. 2a–2c, which show cross-sectional views of a process of forming openings in a multi-layered dielectric layer. The openings are formed by etching the multi-layered dielectric layer, in which every dielectric layer has a single rate of etching.

As shown in FIG. 2a, in a preferable embodiment, a conductive area 210 is formed above a substrate 200. The conductive area 210 is, for example, a metal line. The conductive area 210 also can be a source/drain region or a gate of a transistor provided in the substrate 200. A multi-layered dielectric layer 220 is deposited over the substrate 200. The multi-layered dielectric layer 210 possesses a gradient of etching rate, i.e., the etching rate of the multi-layered dielectric layer 210 varies increasingly from portions near the surface 210a of the conductive area 210 to portions near the surface 220a of the multi-layered dielectric layer 220.

That is, the portions of the multi-layered dielectric layer 210 near the surface 210a, for example, the dielectric layer 222 possesses a lower etching rate, and the portions of the multi-layered dielectric layer 210 near the surface 210a, for example, the dielectric layer 224 possesses a higher etching rate. The multi-layered dielectric layer 210 can be materials consisted of silicide or silicon nitride, therefore, the multi-layered dielectric layer 210 possesses multiple dielectric layers in which have a linear gradient of etching rate.

If the device shown in FIG. 2a is designed for a manufacture process of integrated circuits of which a line width under 0.35 um, a planarization process is introduced for better interconnect reliability. If the device is designed for a manufacture process of integrated circuits of which a line width above 0.5 um, the planarization process may be unnecessary. As shown in FIG. 2b, the planarization is introduced in the substrate.

Referring to FIG. 2c, the multi-layered dielectric layer 220 is defined by using a mask 230. The mask 230 is, for example, a photoresist mask. After an etching process is introduced onto the multi-layered dielectric layer 220, openings are formed beneath the openings 232 of the mask 230 in the multi-layered dielectric layer 220. The openings shown in FIG. 2c by dash lines have oblique sidewalls, for example, the oblique sidewalls 234 and 236 owing to the linear gradient of the etching rate of the multi-layered dielectric layer 220. The oblique sidewalls of the openings in multi-layered dielectric layer 220 can improve the step coverage in the following manufacturing process.

Figure 3:
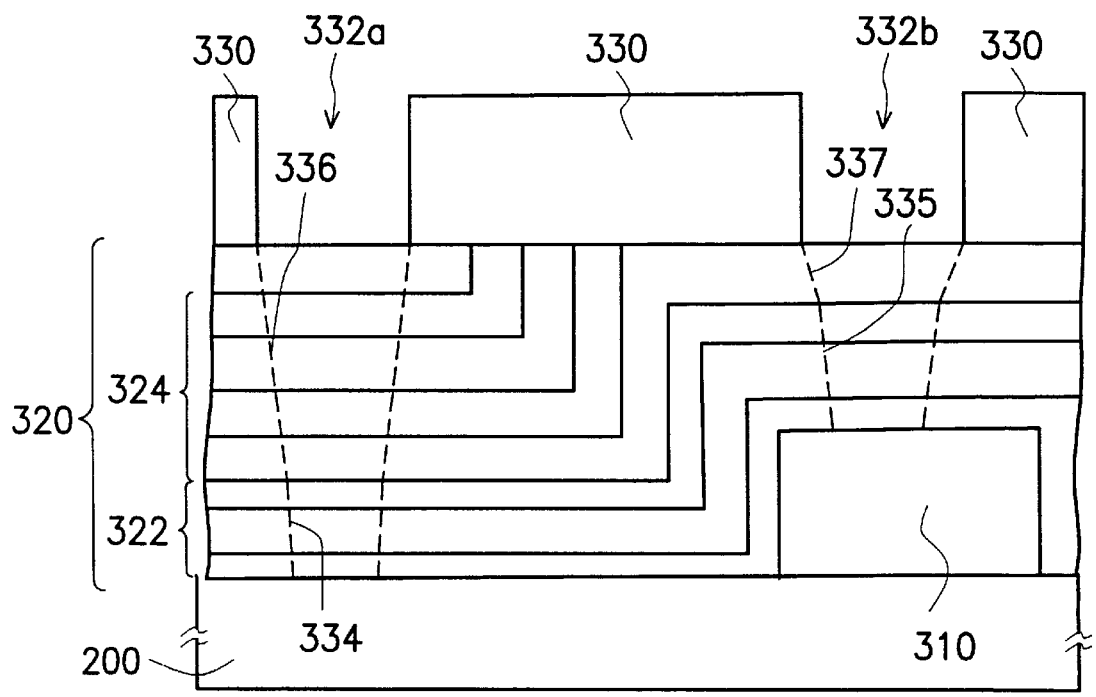
FIG. 3 shows a cross-sectional view of a process of forming openings in a planarized multi-layered dielectric layer in an another embodiment.

Referring to FIG. 3, it shows a cross-sectional view of a process of forming openings in a multi-layered dielectric layer in another embodiment. It shows that the gradient of etching rate of the multi-layered dielectric layer is not restricted in a linear relationship. A conductive area 310 is provided in a substrate 300. The conductive area 310 can be, for example, a metal line or a source/drain region. A multi-layered dielectric layer 320 is deposited over the substrate 300.

The multi-layered dielectric layer 320 possesses a gradient of etching rate, i.e., the etching rate of the multi-layered dielectric layer 310 varies increasingly from portions near the surface of the conductive area 310 to portions near the disclosed surface of the multi-layered dielectric layer 320.

That is, the portions of the multi-layered dielectric layer 310 near the upper surface, for example, portions 324 possess a higher etching rate. The portions of the multi-layered dielectric layer 320 near the lower surface, for example, portions 324 possess a lower etching rate. The multi-layered dielectric layer 320 can be materials consisted of silicon oxide or silicon nitride.

The substrate 300 is performed a planarization process. Then the multi-layered in dielectric layer 320 is defined by a mask 330. After a process of etching, openings are formed in the uncovered portions of the multi-layered dielectric layer 320, for example, openings 332a and 332b. The slope of a sidewall 336 of the upper portions 324 of the multi-layered dielectric layer 320 in the opening 332a is smaller than that in the sidewall 334 of the lower portion 322. In the same point, the slope of a sidewall 337 of the upper portions 324 of the multi-layered dielectric layer 320 in the opening 332b is smaller than that in the sidewall 335 of the lower portion 322. That is, the openings formed in the multi-layered dielectric layer 320 all have oblique sidewalls. It can improve the capability of step coverage in following process.

Figure 4:
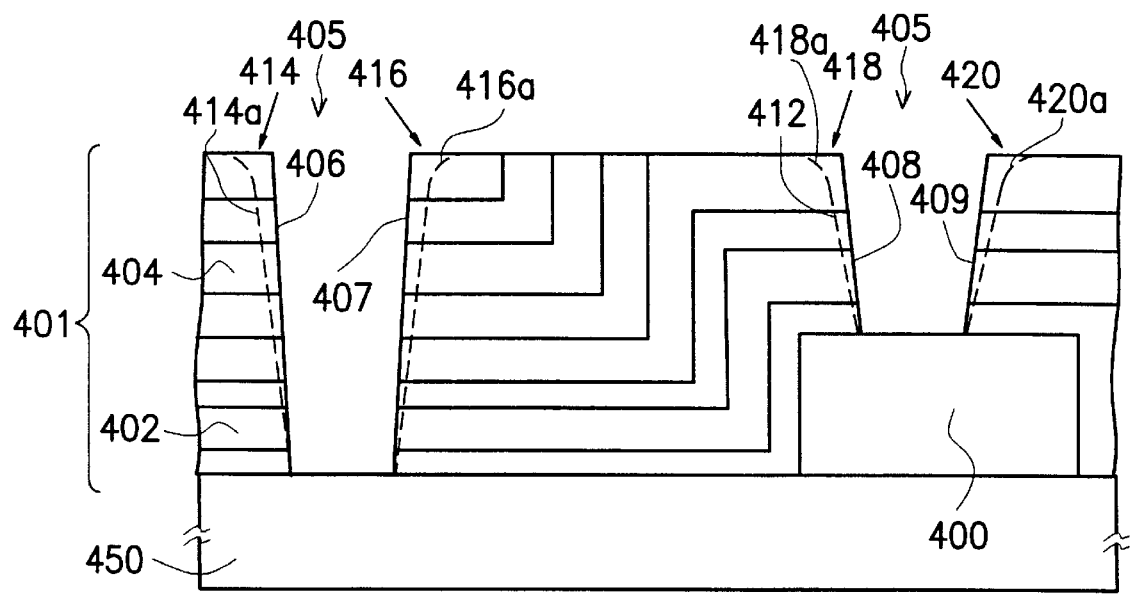
FIG. 4 shows a planarized multi-layered dielectric layer, as shown in FIGS. 2a–2c, is performed by a wet etching method with a predetermined short time.

Referring to FIG. 4, a structure formed as described in the FIG. 2c. A conductive area 400 is formed above a substrate 450 and a multi-layered dielectric layer 401 is continuously formed thereon. The multi-layered dielectric layer 401 possesses a gradient of etching rate, i.e., the etching rate of the multi-layered dielectric layer 401 varies increasingly from portions near the surface of the substrate 450 to portions near the disclosed surface of the multi-layered dielectric layer 401.

That is, the portions of the multi-layered dielectric layer 401 near the surface of the substrate 450, for example, the dielectric layer 402 possesses a lower etching rate. The portions of the multi-layered dielectric layer 401 near the disclosed surface, for example, the dielectric layer 404 possesses a higher etching rate. The multi-layered dielectric layer 401 can be materials consisted of silicon oxide or silicon nitride, therefore, the multi-layered dielectric layer 401 possesses multiple dielectric layers having a linear gradient of etching rate.

The multi-layered dielectric layer 401 has openings 405 formed therein. The openings 405 shown in FIG. 4 have oblique sidewalls, for example, the oblique sidewalls 406, 407, 408 and 409 owing to the linear gradient of the etching rate of the multi-layered dielectric layer 401.

In this embodiment, the substrate 450 is performed by a wet etching method with a predetermined short time. Owing to the linear gradient of the etching rate of the multi-layered dielectric layer 401, a more smooth corner is formed in every sidewall of the opening 450, which is shown in FIG. 4 with a dash line. For example, the angular portions of the openings 405, such as the angular portions 414, 416, 418, 420 respectively on the sidewalls 406, 407, 408 and 409, are etched off and the sidewalls are etched to become smoother as the dash line of the FIG. 4 in cross-sectional views. The preferable profile of the openings can improve the step coverage capability. It is a result that the difference of etching rate of materials in wet etching process is much more than that in dry etching process. The advantage of using the multiple etching rates in the multi-layered dielectric layer is accentuated.

The embodiment above-described can be used in the device in which the line width of the integrated circuits is more than 0.5 um and the planarization process is unnecessary while performing a dry etching process.

Figure 5:
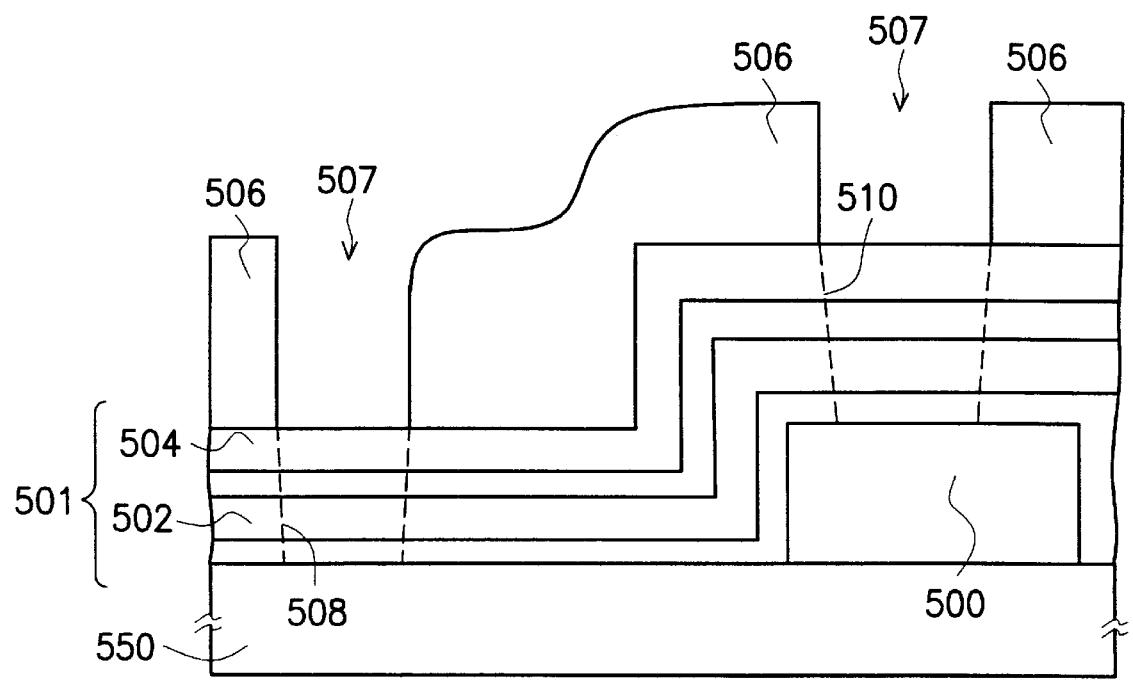
FIG. 5 shows a non-planarized multi-layered dielectric layer, as shown in FIGS. 2a–2c, can be used in the device in which the line width of the integrated circuits is more than 0.5 um and the planarization process is unnecessary while performing a etching process.

Referring to FIG. 5, a structure similar to the structure as described in the FIG. 2a is formed. A conductive area 500 is formed above a substrate 550 and a multi-layered dielectric layer 501 is continuously formed thereon. The multi-layered dielectric layer 501 possesses a gradient of etching rate, i.e., the etching rate of the multi-layered dielectric layer 501 varies increasingly from portions near the surface of the substrate 550 to portions near the disclosed surface of the multi-layered dielectric layer 501.

That is, the portions of the multi-layered dielectric layer 501 near the surface of the substrate 550, for example, the dielectric layer 502 possesses a lower etching rate. The portions of the multi-layered dielectric layer 501 near the disclosed surface, for example, the dielectric layer 504 possesses a higher etching rate. The multi-layered dielectric layer 501 can be materials consisted of silicon oxide or silicon nitride, therefore, the multi-layered dielectric layer 501 possesses multiple dielectric layers having a linear gradient of etching rate.

The multi-layered dielectric layer 501 is defined by a mask 506 and then openings 507 are formed in the multi-layered dielectric layer 501, which are shown in FIG. 5 by the dash lines 508 and 510 in cross-sectional views. This embodiment possesses the same advantage as described in FIGS. 2a–2c. That is, the profile of the opening are almost the same as the profile in FIG. 2c.

The embodiment above-described can be used in the device in which the line width of the integrated circuits is more than 0.5 um and the planarization process is unnecessary while performing a wet etching process.

Figure 6:
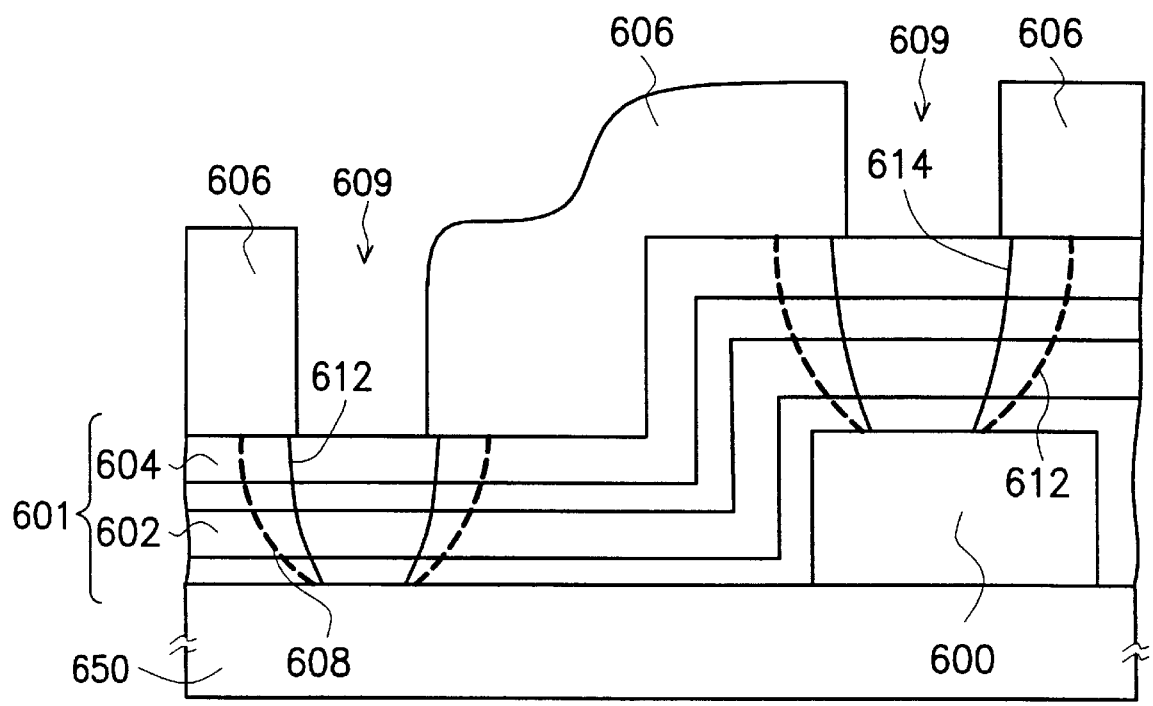
FIG. 6 shows a multi-layered dielectric layer, as shown in FIGS. 2a–2c, is performed by a wet etching method.

Referring to FIG. 6, a structure similar to the structure as described in the FIG. 2a. A conductive area 600 is formed above a substrate 650 and a multi-layered dielectric layer 601 is continuously formed thereon. The multi-layered dielectric layer 601 possesses a gradient of etching rate, i.e., the etching rate of the multi-layered dielectric layer 601 varies increasingly from portions near the surface of the substrate 650 to portions a near the disclosed surface of the multi-layered dielectric layer 601.

That is, the portions of the multi-layered dielectric layer 601 near the surface of the substrate 650, for example, the dielectric layer 602 possesses a higher etching rate. The portions of the multi-layered dielectric layer 601 near the disclosed surface, for example, the dielectric layer 604 possesses a lower etching rate. The multi-layered dielectric layer 601 can be materials consisted of silicon oxide or silicon nitride, therefore, the multi-layered dielectric layer 601 possesses multiple dielectric layers having a linear gradient of etching rate.

The multi-layered dielectric layer 601 is defined by a mask 606 and then openings 609 are formed in the multi-layered dielectric layer 601, which are shown in FIG. 6 by the lines 612 and 614 in cross-sectional views. The openings formed by a conventional method are shown in dash lined of the FIG. 6. The portions of the dielectric layer 604 of the desired openings are etching in a slow rate than that in the portions of the dielectric layer 602. That is the reason why the profile of the openings in the embodiment is better than that in the conventional method. The profile can avoid the contacting problems caused by the increasing of the integration of integrated circuits.

The invention can simultaneously be suitable for a dry etching method and wet etching method, in which depends on the need of the manufacturing process. The invention can also be introduced simultaneously with the planarization process. In addition, the dry etching method can be selectively accommodated with a short time wet etching, in which depends on the conditions desired.

The multi-layered dielectric layer having a gradient of etching rate can be consisted of a single material, which is performed by adjusting conditions of the forming environment of the multi-layered dielectric layer. Furthermore, the multi-layered dielectric layer can be consisted of materials to form the gradient of etching rate, which is also performed by adjusting forming conditions of the multi-layered dielectric layer. In addition, the multi-layered dielectric layer formed in a single material has another advantage, in which dielectric layers of the multi-layered dielectric layer can be formed in situ in a chamber.

There are many methods for forming a multi-layered dielectric layer having a gradient of etching rate. For example, methods of high-density plasma chemical vapor deposition (HDPCVD), plasma enhanced chemical vapor deposition (PECVD), sub-atmospheric chemical vapor deposition (SACVD), and atmospheric pressure chemical vapor deposition (APCVD).

Figure 7:
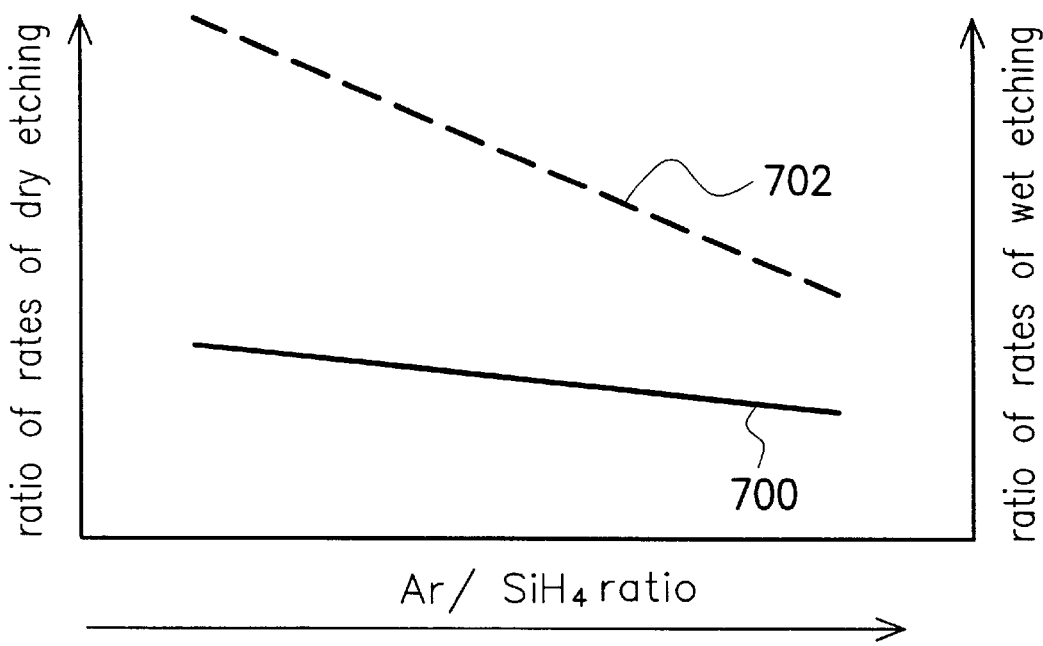
FIG. 7 shows a method of high-density plasma chemical vapor deposition (HDPCVD) to form the multi-layered dielectric layer under a condition of adjusting a ratio of argon gas and $N_2O$ gas.
Figure 8:
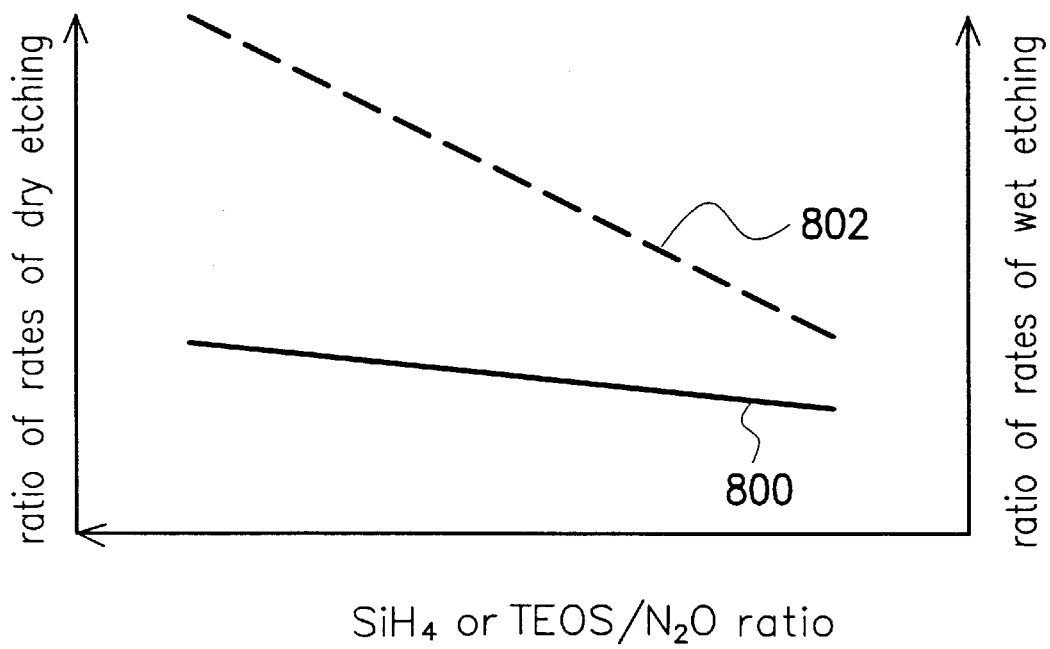
FIG. 8 shows a method of HDPCVD to form the multi-layered dielectric layer under a condition of adjusting the mixing proportion of $SiH_4$ or $TEOS/N_2O$.
Figure 9:
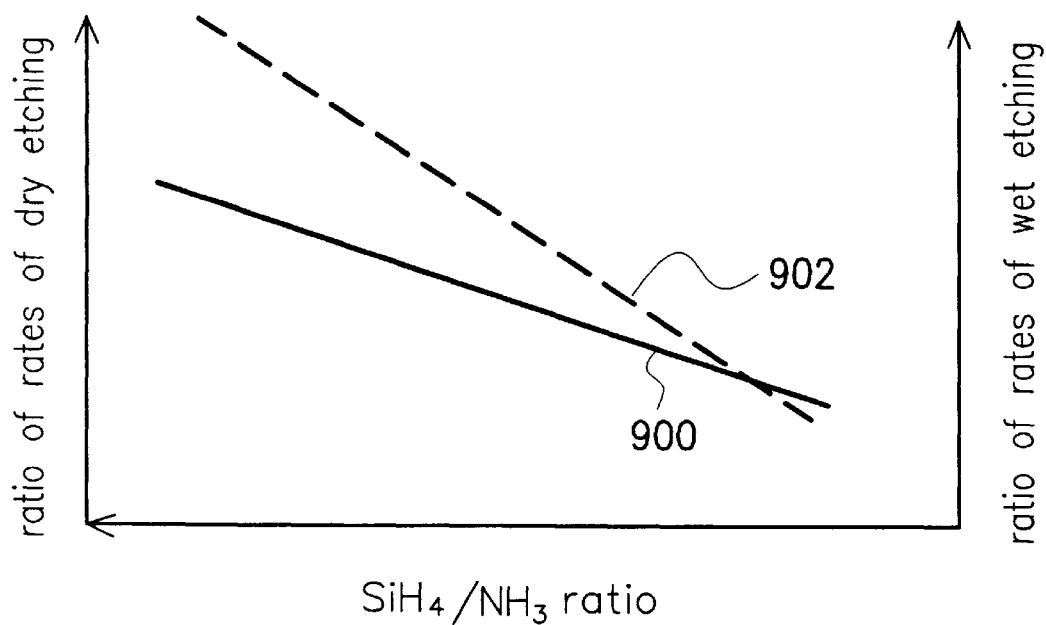
FIG. 9 shows a method of SACVD or APCVD to form the multi-layered dielectric layer under a condition of adjusting the mixing proportion of $TEOS/O_3$.
Figure 10:
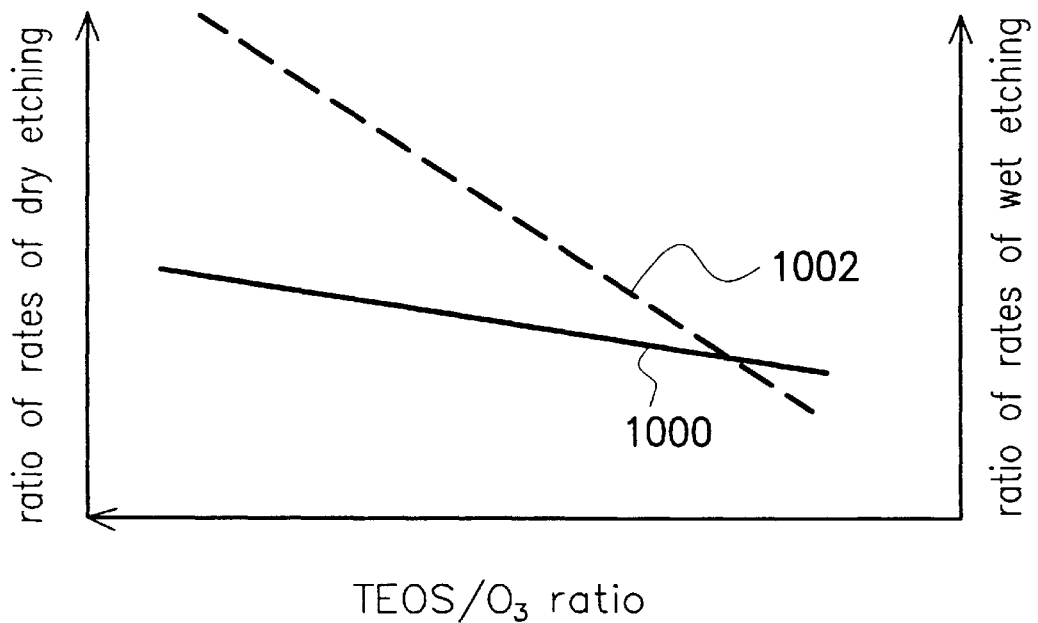
FIG. 10 shows a method of sub-atmospheric chemical vapor deposition to form the multi-layered dielectric layer under the control of the ratio of TEOS and $O_3$ gas.

Referring to FIG. 7, it shows a method of high-density plasma chemical vapor deposition (HDPCVD) to form the multi-layered dielectric layer under a condition of adjusting a ratio of argon gas and $SiH_4$ gas. Referring to FIG. 8, it shows a method of PEPCVD to form the multi-layered dielectric layer under a condition of adjusting the mixing proportion of $SiH_4$ or $TEOS/N_2O$. Referring to FIG. 9, it shows a method of PECVD to form the multi-layered dielectric layer under a condition of adjusting the mixing proportion of $TEOS/O_3$. Referring to FIG. 10, it shows a method of sub-atmospheric chemical vapor deposition method under the control of the ratio of TEOS and $O_3$ gas.

Referring to FIG. 7, the x-coordinate represents a ratio of Ar gas and $SiH_4$ gas and the y-coordinate represents a proportion of rates of etching. Under the control of the ratio of Ar gas and $SiH_4$ gas, the multi-layered dielectric layer can be formed. The $SiH_4$ gas can be used for depositing the dielectric layer. If the materials deposited from the $SiH_4$ gas are not enough, the materials will be etched owing to the erosion of the Ar gas. Therefore, the etching rate of the deposited dielectric layer is reduced by increasing the proportion of the etching/depositing proportion, i.e., the proportion of the Ar gas and the $SiH_4$ gas.

As shown in FIG. 7, a slope of the dash line 702 which represents the wet etching rate is higher than that of the solid line 700 which represents the dry etching rate. That is, depositing under different conditions affects the etching rate. The effect is accentuated in a wet etching method.

Referring to FIG. 8, the x-coordinate represents a ratio of $SiH_4$ or $TEOS/N_2O$ gas and the y-coordinate represents a proportion of rates of etching. Under the control of the ratio of $SiH_4$ gas or $TEOS/N_2O$ gas, the multi-layered dielectric layer can be formed. The $SiH_4$ or TEOS gas can be used for depositing the dielectric layer. The $N_2O$ gas possesses a characteristic of oxidation. If the depositing rate of the $SiH_4$ gas or TEOS gas is fast, the rate of oxidation of the $N_2O$ gas is reduced. Therefore, the materials deposited are of laxity, that is, the materials are easily etched off. Oxidation is an important factor for tenacity of the deposited dielectric layer.

As shown in FIG. 8, a slope of the dash line 802 which represents the wet etching rate is bigger than that of the solid line 800 which represents the dry etching rate. That is, depositing under different conditions affects the etching rate. The effect is accentuated in a wet etching method.

In addition, the formation of multi-layered dielectric layer can also be controlled by other conditions. While the temperature for controlling the depositing is increased, the ratio of depositing/oxidation is reduced and the formed multi-layered dielectric layer becomes tenacious. Therefore, the etching rate is reduced. Moreover, reducing the reaction pressure or increasing the radio frequency power (RF power) can also reduce the ratio of depositing/oxidation, and make the multi-layered dielectric layer tenacious and the etching rate reduced.

Referring to FIG. 9, the x-coordinate represents a ratio of $SiH_4/NH_3$ gas and the y-coordinate represents a proportion of rates of etching. Performing a high-density plasma chemical vapor deposition method under the control of the ratio of $SiH_4$ gas and $NH_3$ gas, the multi-layered dielectric layer can be formed. The $SiH_4$ gas can be used for depositing the dielectric layer. The $NH_3$ gas possesses a characteristic of nitridation. If the depositing rate of the $SiH_4$ gas is fast, the rate of nitridation of the $NH_3$ gas is reduced. Therefore, the materials deposited are of laxity, that is, the materials are easily etched off. Nitridation is an important factor for tenacity of the deposited dielectric layer.

As shown in FIG. 9, a slope of the dash line 902 which represents the wet etching rate is bigger than that of the solid line 900 which represents the dry etching rate. That is, depositing under different conditions affects the etching rate. The effect is accentuated in a wet etching method.

In addition the formation of multi-layered dielectric layer can also be controlled by other conditions. While the temperature for controlling the depositing is increased, he ratio of depositing/oxidation is reduced and the formed multi-layered dielectric layer becomes tenacious. Therefore, the etching rate is reduced. Moreover, reducing the reaction pressure or increasing the radio frequency power (RF power) can also reduce the ratio of depositing/oxidation, and make the multi-layered dielectric layer tenacious and the etching rate reduced.

Referring to FIG. 10, the x-coordinate represents a ratio of $TEOS/O_3$ gas and the y-coordinate represents a proportion of rates of etching. Performing a sub-atmospheric chemical vapor deposition method under the control of the ratio of TEOS and $O_3$ gas, the multi-layered dielectric layer can be formed. The TEOS gas can be used for depositing the dielectric layer. The $O_3$ gas possesses a characteristic of oxidation. If the depositing rate of the TEOS gas is fast, the rate of oxidation of the $O_3$ gas is reduced. Therefore, the materials deposited are of laxity, that is, the materials are easily etched off. Oxidation is an important factor for tenacity of the deposited dielectric layer.

As shown in FIG. 10, a slope of the dash line 1002 which represents the wet etching rate is bigger than that of the solid line 1000 which represents the dry etching rate. That is, depositing under different conditions affects the etching rate. The effect is accentuated in a wet etching method.

In addition, the formation of multi-layered dielectric layer can also be controlled by other conditions. While the temperature for controlling the depositing is increased, the ratio of depositing/oxidation is reduced and the formed multi-layered dielectric layer becomes tenacious. Therefore, the etching rate is reduced. Moreover, reducing the reaction pressure or increasing the radio frequency power (RF power) can also reduce the ratio of depositing/oxidation, and make the multi-layered dielectric layer tenacious and the etching rate reduced.

The multi-layered dielectric layer can be formed preferably by controlling the forming conditions. The multi-layered dielectric layer can also be formed by one kind of dielectric material, or can also be formed by many kinds of the dielectric materials.

For example, a desired multi-layered dielectric layer in which the etching rate varies decreasingly from portions near the surface of the conductive area to portions near the disclosed surface of the multi-layered dielectric layer is formed. The lower portions of the multi-layered dielectric layer near the surface of the conductive area can be formed by a sub-atmospheric chemical vapor deposition method. The intermediary portions above the lower portions can be silicon dioxide formed by a method of high-density plasma chemical vapor deposition. The portions near the disclosed surface of the multi-layered dielectric layer can be silicon nitride formed by a method of high-density plasma chemical vapor deposition.

As a result, the biggest one of the etching rates of the dielectric layers is the silicon oxide layer formed adjacent to the conductive area. The next is the silicon dioxide. The smallest one is the silicon nitride layer. The desired gradient of etching rate in the multi-layered dielectric layer is performed. Therefore, the opening formed in the multi-layered dielectric layer possesses a good profile for the following manufacturing process. The multi-layered dielectric layer in which the etching rate varies increasingly from portions near the surface of the conductive area to portions near the disclosed surface of the multi-layered dielectric layer also can be formed by above-described methods, just to adjust the sequence.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A structure of a substrate, which comprising:
a conductive area formed in the substrate; and
a multi-layered dielectric layer comprising at least three layers of dielectric materials formed above the conductive area on the substrate, wherein a first part of the multi-layered dielectric layer contains all said layers of dielectric materials and a second part of the multi-layered dielectric layer contains only some of said layers of dielectric materials, wherein the first part and the second part of the multi-layered dielectric layer have a gradient of etching rates and at least an opening formed in the multi-layered dielectric layer in said first part, wherein the diameter of the opening near the surface of the conductive area is smaller than the diameter of the opening near the upper surface of the multi-layered dielectric layer.

2. The structure of claim 1, wherein the conductive area is a source/drain region in the substrate.

3. The structure of claim 1, wherein the conductive area is a gate of a transistor.

4. The structure of claim 1, wherein the conductive layer is a metal line.

5. The structure of claim 1, wherein the multi-layered dielectric layer is formed by a method of high-density plasma chemical vapor deposition by using a material of silicon oxide.

6. The structure of claim 5, wherein the gradient of etching rates of the multi-layered dielectric layer is formed by adjusting at least a forming condition of the multi-layered dielectric layer, wherein the forming condition is selected from a group of adjusting a ratio of etching gas and depositing gas, a reaction temperature, and a reaction pressure.

7. The structure of claim 1, wherein the multi-layered dielectric layer is formed by a method of plasma enhanced chemical vapor deposition by using a material of silicon oxide.

8. The structure of claim 7, wherein the gradient of etching rates of the multi-layered dielectric layer is formed by adjusting at least a forming condition of the multi-layered dielectric layer, wherein the forming condition is selected from a group of adjusting a ratio of $SiH_4/N_2O$, a ratio of $TEOS/N_2O$ gas, a reaction temperature, a reaction pressure and radio frequency power.

9. The structure of claim 1, wherein the multi-layered dielectric layer is formed by a method of high-density plasma chemical vapor deposition by using a material of silicon nitride.

10. The structure of claim 9, wherein the gradient of etching rates of the multi-layered dielectric layer is formed by adjusting at least a forming condition of the multi-layered dielectric layer, wherein the forming condition is selected from a group of a ratio of $SiH_4/N_2O$, a ratio of $TEOS/N_2O$ gas, a reaction temperature, a reaction pressure and radio frequency power.

11. The structure of claim 1, wherein the multi-layered dielectric layer is formed by a method of sub-atmospheric chemical vapor deposition by using a material of silicon oxide.

12. The structure of claim 11, wherein the gradient of etching rates of the multi-layered dielectric layer is formed by adjusting at least a forming condition of the multi-layered dielectric layer, wherein the forming condition is selected from a group of adjusting a ratio of $TEOS/O_3$ gas, a reaction temperature, and a reaction pressure.

13. The structure of claim 1, wherein the multi-layered dielectric layer is formed by a method of atmospheric chemical vapor deposition by using a material of silicon oxide.

14. The structure of claim 13, wherein the gradient of etching rates of the multi-layered dielectric layer is formed by adjusting at least a forming condition of the multi-layered dielectric layer, wherein the forming condition is selected from a group of a ratio of $TEOS/O_3$ gas, a reaction temperature, and a reaction pressure.

15. The structure of claim 1, wherein the gradient of etching rates of the multi-layered dielectric layer is linear.

16. The structure of claim 1, wherein the gradient of etching rate of the multi-layered dielectric layer is linear has a plurality of sub-gradients.

17. The structure of claim 1, wherein the multi-layered dielectric layer is defined by a method of wet etching, and the etching rate of the multi-layered dielectric layer varies decreasingly from portions near the surface of the conductive area to portions near the surface of the multi-layered dielectric layer.

18. The structure of claim 1, wherein the structure of the multi-layered dielectric layer comprising:

a layer of silicon nitride formed above the conductive area;

a first layer of silicon oxide formed above the layer of silicon nitride, wherein the first layer of silicon oxide is formed by a method of plasma enhanced chemical vapor deposition; and a second layer of silicon oxide formed above the first layer of silicon oxide, wherein the second layer of silicon oxide is formed by a method of sub-atmospheric chemical vapor deposition.

19. The structure for a substrate of claim 18, wherein the opening is formed by a single etching process.

20. The structure for a substrate of claim 1, wherein the first part of the multi-layered dielectric layer has a first opening and the second part of the multi-layered dielectric layer has a second opening, and the first opening and the second opening have different sidewall profiles.

* * * * *